US006537914B1

United States Patent
Park et al.

(10) Patent No.: US 6,537,914 B1
(45) Date of Patent: Mar. 25, 2003

(54) INTEGRATED CIRCUIT DEVICE ISOLATION METHODS USING HIGH SELECTIVITY CHEMICAL-MECHANICAL POLISHING

(75) Inventors: Tai-su Park, Kyungki-do (KR); Moon-han Park, Kyungki-do (KR); Kyung-won Park, Kyungki-do (KR); Han-sin Lee, Kyungki-do (KR); Jung-yup Kim, Kyungki-do (KR); Chang-ki Hong, Kyungki-do (KR); Ho-kyu Kang, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/570,225

(22) Filed: May 12, 2000

(30) Foreign Application Priority Data

May 12, 1999 (KR) ............................................. 99-16974

(51) Int. Cl.[7] ........................................... H01L 21/302
(52) U.S. Cl. ...................... 438/692; 438/700; 438/702
(58) Field of Search ................................ 438/691–693, 438/700, 702, 719, 723, 724; 257/79.1, 79.2, 397; 216/89

(56) References Cited

U.S. PATENT DOCUMENTS

| 4,741,799 | A | | 5/1988 | Chen et al. ................. 156/643 |
|---|---|---|---|---|
| 5,275,965 | A | | 1/1994 | Manning ..................... 437/67 |
| 5,312,770 | A | | 5/1994 | Pasch ......................... 437/67 |
| 5,436,488 | A | * | 7/1995 | Poon et al. .................. 257/397 |
| 5,441,094 | A | | 8/1995 | Pasch ......................... 156/636 |
| 5,447,884 | A | * | 9/1995 | Fahey et al. ................. 437/67 |
| 5,453,639 | A | | 9/1995 | Cronin et al. ............... 257/510 |
| 5,731,241 | A | * | 3/1998 | Jang et al. ................... 438/424 |
| 5,738,800 | A | * | 4/1998 | Hosai et al. ................. 216/99 |
| 5,747,866 | A | * | 5/1998 | Ho et al. ..................... 257/506 |
| 5,759,917 | A | * | 6/1998 | Grover et al. .............. 438/690 |
| 5,966,614 | A | | 10/1999 | Park et al. ................... 438/401 |
| 5,981,394 | A | * | 11/1999 | Ohashi et al. .............. 438/692 |
| 6,132,637 | A | * | 10/2000 | Hosali et al. ............... 252/79.1 |

OTHER PUBLICATIONS

Fazan et al., *A Highly Manufacturable Trench Isolation Process for Deep Submicron DRAMs*, IEEE International Electron Devices Meeting 1993, pp. 57–60.
Park et al., *A Very Simple Trench Isolation (VSTI) Technology with Chemo–Mechanically Polished (CMP) Substrate Si*, 1997 Symposium on VLSI Technology Digest of Technical Papers, pp. 121–122.

* cited by examiner

Primary Examiner—Benjamin L. Utech
Assistant Examiner—Duy-Vu Deo
(74) Attorney, Agent, or Firm—Myers Bigel Sibley & Sajovec, P.A.

(57) ABSTRACT

Trench isolation methods for integrated circuits may reduce irregularities in the formation of an isolation layer through use of a high selectivity chemical-mechanical polishing (CMP) operation. In particular, a substrate surface is etched to form a trench. An insulation layer is then formed on the substrate surface and in the trench. The insulation layer is chemical-mechanical polished using a slurry that includes a $CeO_2$ group abrasive to form an isolation layer in the trench. The CMP selectivity ratio of a slurry that includes a $CeO_2$ group abrasive may be sufficient to allow the substrate surface to be used as a CMP stop. As a result, a more consistent level of polishing may be maintained over the substrate surface, which may result in a more uniform thickness in the isolation layer.

12 Claims, 7 Drawing Sheets

INTEGRATED CIRCUIT DEVICE ISOLATION METHODS USING HIGH SELECTIVITY CHEMICAL-MECHANICAL POLISHING

RELATED APPLICATION

This application claims the benefit of Korean Patent Application No. 99-16974, filed May 12, 1999, the disclosure of which is hereby incorporated herein by reference.

FIELD OF THE INVENTION

The present invention relates generally to isolation methods for integrated circuit devices and, more particularly, to trench isolation methods for integrated circuit devices.

BACKGROUND OF THE INVENTION

As integrated circuit devices become more highly integrated and include finer geometries, it may become increasingly important to reduce the size of isolation regions that are used to isolate active devices, such as transistors, from one another. The initial formation of isolation regions may determine the size of an active region and the process margins for subsequent processing. Accordingly, reduction of the size of the isolation regions may be desirable.

LOCal Oxidation of Silicon (LOCOS) may be used for fabricating isolation regions in integrated circuits. The LOCOS process is generally relatively simple. In highly integrated devices, however, such as 256 MBB DRAM devices, as the width of the isolation region is reduced, a punchthrough may be caused by "bird's beak" during oxidation. This may reduce the thickness of a field oxide film and may reduce the size of the active regions.

An isolation method may also use a trench, rather than forming a field oxide layer by thermal oxidation. In trench isolation methods, a trench is formed on the integrated circuit device and is filled with an insulating material, such as an oxide layer, to form an isolation region that can be smaller than that formed by the LOCOS method. Moreover, problems associated with the LOCOS method and problems associated with thermal oxidation may be controlled.

Figure 1:
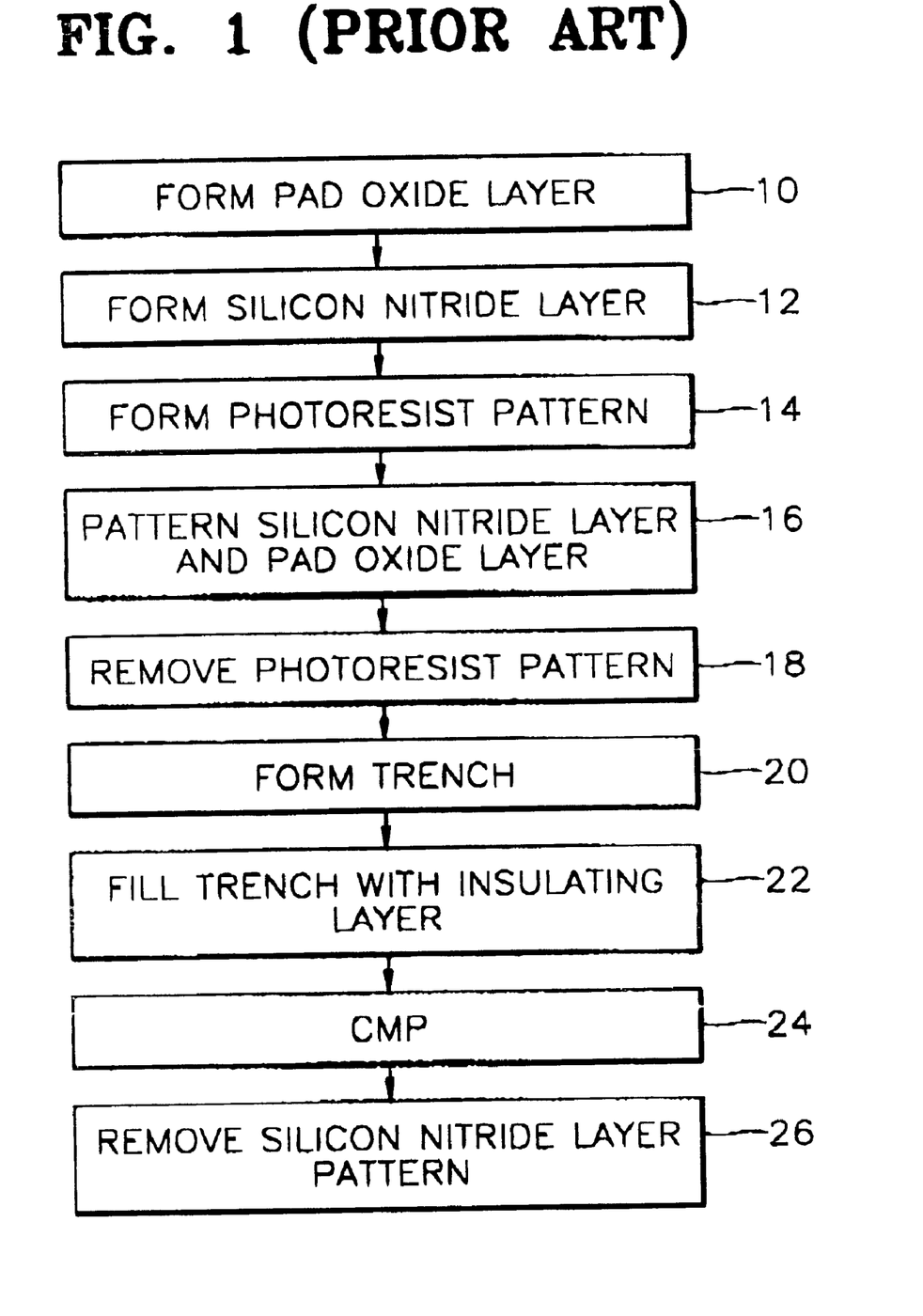
FIG. 1 is a flow chart that illustrates a conventional shallow trench isolation (STI) method.

FIG. 1 illustrates fabrication steps for a conventional shallow trench isolation (STI) method. As shown in FIG. 1, a pad oxide layer is formed on an integrated circuit substrate, such as a semiconductor substrate, at block 10. A silicon nitride layer is then formed on the pad oxide layer at block 12. A photoresist layer is formed on the silicon nitride layer at block 14. The photoresist layer is patterned by conventional methods to form a photoresist mask pattern. At block 16, the silicon nitride layer is patterned using the patterned photoresist as a mask. The photoresist is then removed at block 18. The silicon nitride layer is then used to form a trench at block 20. An insulation layer is formed in the trench and on the substrate to bury the trench at block 22. Chemical-mechanical polishing (CMP) is then used to planarize the trench at block 24. The silicon nitride layer is then removed at block 26. The details of conventional trench isolation are generally known to those having skill in the art and need not be described further herein.

The STI method described in the foregoing may avoid thermal oxidation problems associated with the LOCOS method because the isolation layer is not formed by a local oxidation step. Nevertheless, the conventional STI method may be relatively complicated, which may result in higher manufacturing costs than may be incurred with the LOCOS method. In addition, the conventional STI method may result in thick silicon nitride layers formed on both sides of the trench, which may increase the aspect ratio of the trench. An increase in the aspect ratio of the trench due to thick silicon nitride layers may cause poor step coverage of a chemical vapor deposition (CVD) oxide layer, which may generate voids in the trench. Consequently, there exists a need for improved trench isolation methods.

SUMMARY OF THE INVENTION

The present invention may simplify trench isolation methods for integrated circuits and may also provide improved performance of integrated circuits by reducing irregularities in the formation of an isolation layer through use of a high selectivity chemical-mechanical polishing (CMP) operation. According to embodiments of the present invention, a substrate surface is etched to form a trench. An insulation layer is then formed on the substrate surface and in the trench. The insulation layer is chemical-mechanical polished using a slurry that includes a $CeO_2$ group abrasive to form an isolation layer in the trench. Advantageously, the CMP selectivity ratio of a slurry that includes a $CeO_2$ group abrasive may be sufficient to allow the substrate surface to be used as a CMP stop. As a result, a more consistent level of polishing may be maintained over the substrate surface, which may result in a more uniform thickness in the isolation layer.

According to other embodiments of the present invention, a photoresist mask pattern may be formed on the substrate surface prior to the formation of a trench therein. This photoresist mask pattern may then be removed from the substrate surface after the trench is formed and prior to the formation of the insulation layer on the substrate surface and in the trench.

According to still other embodiments of the present invention, the CMP slurry may further include an anionic surfactant, such as polyvinylsulphonate (PVS), and the pH of the slurry may be maintained at approximately 7. This may allow the zeta potential of the substrate surface to be a positive value while the zeta potential of the insulation layer is a negative value. The anionic surfactant may then adhere to the substrate surface thereby suppressing reaction of the $CeO_2$ group abrasive therewith. Preferably, the slurry has a CMP selectivity ratio of at least 1:10 between the substrate surface and the insulation layer, respectively.

According to still other embodiments of the present invention, a thermal oxide layer may be formed on the substrate surface and in the trench after the trench is formed and prior to the formation of the insulation layer on the substrate surface and in the trench. In addition, thermal treatment may be performed on the insulation layer after it is formed on the substrate surface and in the trench.

According to still other embodiments of the present invention, after chemical-mechanical polishing, a step may be formed between the isolation layer and the substrate surface to form an alignment key for subsequent processing. The step may be formed by etching the substrate surface to recess the substrate surface relative to the isolation layer.

According to still other embodiments of the present invention, after chemical-mechanical polishing, an oxide layer may be formed on the isolation layer and ions may be implanted through the oxide layer. The ions may be used to form wells and channel stops and to control the threshold voltage of devices that are subsequently formed.

In alternative embodiments of the present invention, a substrate surface is etched to form a trench and a nitride liner is formed on the substrate surface and in the trench. An insulation layer is then formed on the nitride liner such that the trench is filled. The insulation layer is then chemical-mechanical polished to form an isolation layer in the trench.

According to other embodiments of the present invention, a nitride layer may be formed directly on the substrate surface prior to the formation of a trench therein. The nitride layer may comprise silicon oxynitride (SiON) and, along with the nitride liner, may be used as a CMP stop to improve the uniformity of the thickness of the isolation layer.

According to still other embodiments of the present invention, a photoresist mask pattern may be formed on the substrate surface prior to the formation of the trench therein. This photoresist mask pattern may then be removed from the substrate surface after the trench is formed and prior to the formation of the nitride liner on the substrate surface and in the trench.

According to still other embodiments of the present invention, the chemical-mechanical polishing may be performed using a slurry that comprises a $CeO_2$ group abrasive and an anionic surfactant. The CMP slurry may further include an anionic surfactant and the pH of the slurry may be maintained at approximately 7 to facilitate polishing of the insulation layer. Preferably, the slurry has a CMP selectivity ratio of at least 1:20 between the nitride liner and the insulation layer, respectively.

According to still other embodiments of the present invention, a thermal oxide layer may be formed on the substrate surface and in the trench after the trench is formed and prior to the formation of the nitride liner on the substrate surface and in the trench. In addition, thermal treatment may be performed on the insulation layer after it is formed on the nitride liner.

According to still other embodiments of the present invention, after chemical-mechanical polishing, the nitride liner may be removed from the substrate surface. Moreover, a step may be formed between the isolation layer and the substrate surface to thereby form an alignment key for subsequent processing. The step may be formed by etching the substrate surface to recess the substrate surface relative to the isolation layer.

Accordingly, conventional trench isolation methods for integrated circuits may be improved by eliminating fabrication steps, such as the formation of PAD oxide and silicon nitride layers, and/or by reducing irregularities in the formation of an isolation layer through use of a high selectivity CMP operation. Simplified processing and improved performance may thus be obtained.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. In the drawings, the thickness of layers and regions are exaggerated for clarity. Like numbers refer to like elements throughout the description of the figures. Moreover, each embodiment described and illustrated herein includes its complementary conductivity type embodiment as well. It will also be understood that when a layer or region is referred to as being "on" another layer, region or substrate, it can be directly on the other layer, region or substrate, or intervening layers or regions may also be present. Conversely, when a layer or region is indicated as being "directly on" another layer, region or substrate, intervening layers or regions are not present.

Figure 2:
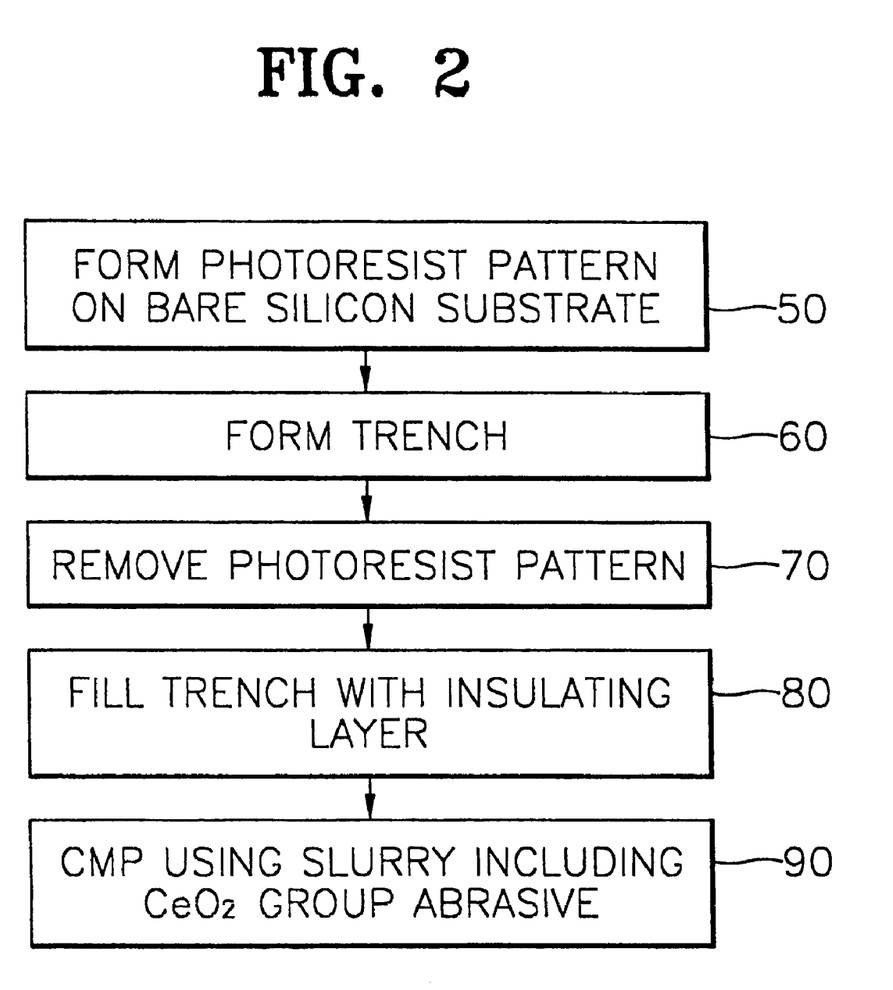
FIG. 2 is a flow chart that illustrates trench isolation methods according to a first embodiment of the present invention.

With reference to FIG. 2, exemplary trench isolation operations according to a first embodiment of the present invention begin at block 50 where a photoresist mask pattern may be formed on a bare substrate surface (i. e., no native oxide and no nitride layer being present thereon). Next, the substrate surface may be etched through the photoresist pattern to form a trench at block 60. Advantageously, the photoresist pattern may be used as a mask, which may simplify the process of manufacturing integrated circuit devices and may also reduce the aspect ratio of the trench. The photoresist pattern may then be removed at block 70 and an insulation layer may be formed on the substrate surface and trench such that the trench is filled at block 80. Once the trench has been filled with the insulation layer, the upper surface of the insulation layer material may be planarized to substantially the same level as the substrate surface by performing a chemical-mechanical polishing (CMP) operation at block 90. In particular, the insulation layer is chemical-mechanical polished using a slurry that includes a $CeO_2$ group abrasive to form an isolation layer in the trench. The CMP selectivity ratio of the slurry is preferably sufficient to allow the substrate surface to be used as a CMP stop. As a result, the uniformity in the thickness of the isolation layer may be improved.

Figure 3A:
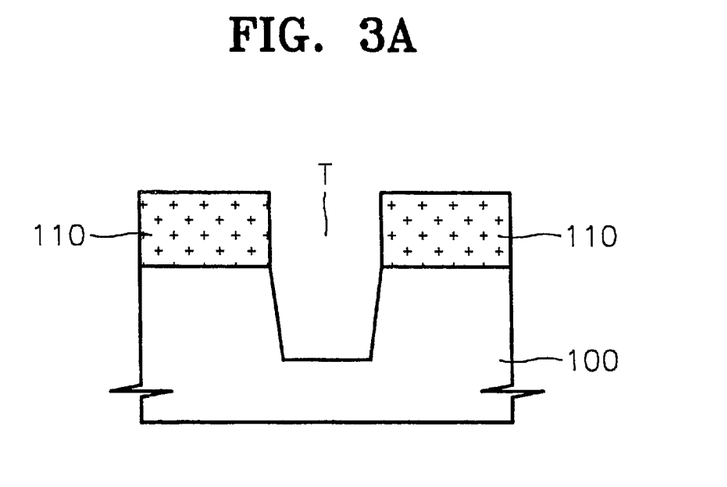
FIGS. 3A–3C are cross-sectional views of integrated circuits that illustrate trench isolation methods according to the first embodiment of the present invention.

Integrated circuits that illustrate trench isolation methods of FIG. 2 will be described hereafter with reference to FIGS. 3A–3C. FIG. 3A illustrates the formation of a photoresist mask pattern on a substrate surface. Specifically, a photoresist is coated on one side of a semiconductor substrate 100, such as a bare silicon substrate, to form a photoresist layer. The photoresist layer is then patterned until part of the semiconductor substrate 100 is exposed to form a photoresist mask pattern 110. Thereafter, a trench T is formed by etching the semiconductor substrate 100 to a predetermined depth using the photoresist mask pattern 110 as an etch mask.

The trench T may be formed by anisotropic etching using $Cl_2$ and HBr as etching gasses. Furthermore, the trench T may be etched to a depth of approximately 0.25 μm, which is generally sufficient to electrically insulate adjacent integrated circuit devices. If a trench T depth of 0.25 μm is used, then the photoresist mask pattern 110 may be formed to a thickness of approximately 0.7 μm.

Figure 3B:
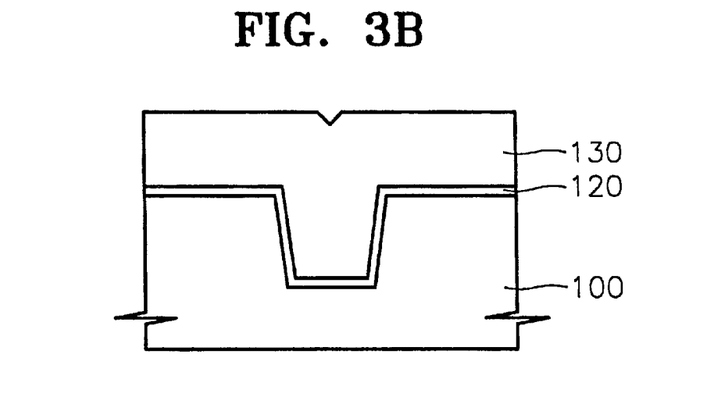

FIG. 3B illustrates the formation of an insulation layer on the semiconductor substrate 100 surface and in the trench T. First, the photoresist mask pattern may be removed from the semiconductor substrate 100 surface. Next, an insulation layer 130 having a predetermined thickness may be formed on the semiconductor substrate 100 surface and in the trench T such that the trench T is buried. The insulation layer 130 may comprise undoped silicon glass (USG), which is based on tetra-ethyl ortho silicate glass (TEOS). Alternatively, the insulation layer 130 may comprise an oxide layer that is formed using high density plasma chemical vapor deposition (CVD), or the insulation layer 130 may comprise a USG layer formed at a high temperature.

According to an embodiment of the invention, a thermal oxide layer 120 may be formed on the semiconductor substrate 100 surface and in the trench T to a thickness of approximately 30 Å–150 Å prior to the formation of the insulation layer 130. The thermal oxide layer 120 may remove defects generated by anisotropic etching in forming the trench T and may stabilize the upper surface of the semiconductor substrate 100 through $Si—O_2$ bonding to prevent leakage of current through the surface of the trench T. In addition, the thermal oxide layer 120 may alleviate the concentration of stress at the bottom corners of the trench T by rounding the corners of the trench T.

According to another aspect of the invention, after forming the insulation layer 130, a thermal treatment may be performed at approximately 700° C.–1200° C. for several minutes to several hours. The thermal treatment may be performed in a wet oxidation environment, a dry oxidation environment, or in the presence of an inert gas, such as $N_2$ or Ar.

Figure 3C:
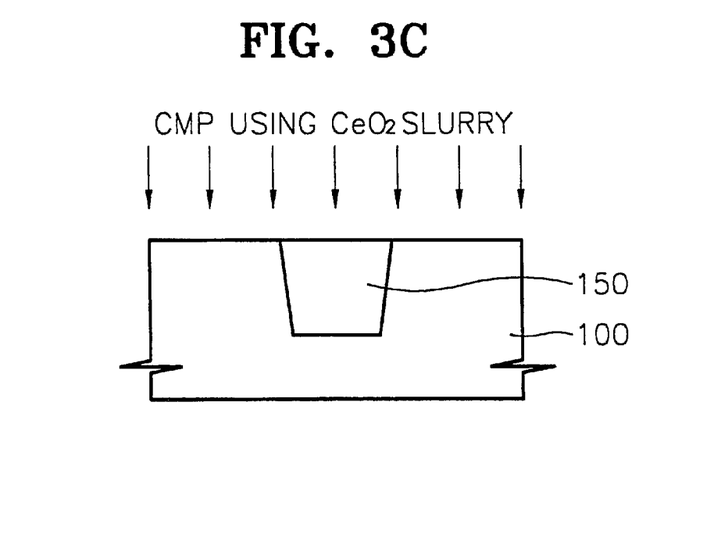

FIG. 3C illustrates the formation of an isolation layer 150 in the trench T by performing a CMP operation on the insulation layer 130. In particular, CMP is performed using a slurry that includes a Lanthanide Series metal oxide abrasive, such as a $CeO_2$ group abrasive, until the semiconductor substrate 100 is exposed to planarize the insulation layer 130. The slurry may comprise an aqueous mixture of particles (e.g., the $CeO_2$ group abrasive), chemicals, and water. The particles may provide mechanical polishing while the chemicals may provide chemical polishing. Preferably, the slurry has a CMP selectivity ratio of at least 1:10 between the semiconductor substrate 100 surface and the insulation layer 130, respectively. Furthermore, the slurry preferably includes a highly anionic surfactant, such as polyvinylsulphonate (PVS), in addition to the $CeO_2$ group abrasive. It is also preferable that the pH of the slurry be controlled such that the zeta potential of the insulation layer 130 has a negative value and the zeta potential of the semiconductor substrate 100 has a positive value. The pH of the slurry may be adjusted through the addition of deionized water, KOH, and/or NaOH to the slurry.

Figure 4:
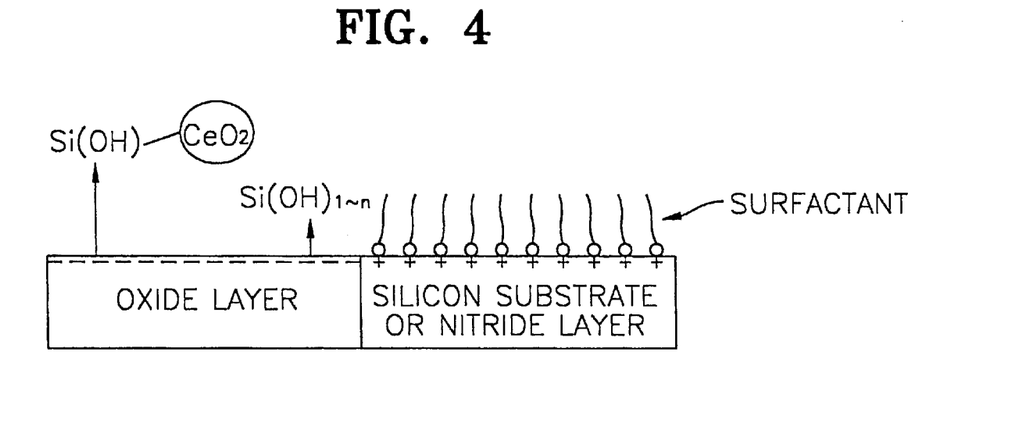
FIG. 4 is a cross-sectional view of integrated circuits that illustrates chemical-mechanical polishing according to the first embodiment of the present invention.

FIG. 4 illustrates the CMP operation using a slurry that includes a $CeO_2$ group abrasive and an anionic surfactant in more detail. By maintaining the pH of the slurry as discussed in the foregoing, the anionic surfactant may adhere to the semiconductor substrate 100 surface, which has a positive zeta potential. This may suppress reaction of the $CeO_2$ group abrasive with the semiconductor substrate 100. Conversely, little to none of the anionic surfactant may adhere to the insulation layer 130, which has a negative zeta potential. As a result, the $CeO_2$ group abrasive may react with the insulation layer 130 to facilitate removal of the insulation layer 130. As shown in FIG. 4, the surface of the positively charged semiconductor substrate 100 (or the surface of a silicon nitride layer as will be described in alternative embodiments of the present invention to be discussed hereinafter) is passivated with the anionic surfactant so that the $CeO_2$ group abrasive polishes the surface of the insulation layer 130.

It may be helpful to briefly review a conventional CMP operation to provide contrast with present invention. A conventional slurry that includes a silica group abrasive may have a CMP selectivity ratio of approximately 1:4 between a nitride layer and an oxide layer (i.e., an insulation layer), respectively. Unfortunately, this CMP selectivity ratio is typically too low to allow the silicon substrate to be used as a CMP stop. Therefore, the CMP process is typically controlled by time, which may result in inconsistencies in the amount of oxide layer that is removed. As a result, irregularities may be introduced into the trench depth at one or more regions of the substrate. If the trench is formed such that the sidewall of the trench is inclined, then irregularities in the amount of the oxide layer removed by the CMP operation may cause the size of an active region to be different from the intended or designed value. For example, if the amount of the oxide layer removed by the CMP operation is larger in one particular region, then the size of the isolation region may be reduced in this particular region. This may cause irregular widths in a metal oxide semiconductor (MOS) transistor and variations in threshold voltage and current in the MOS transistor.

By contrast, it has been found that when the pH of a slurry that includes a $CeO_2$ group abrasive and an anionic surfactant is maintained at approximately 7, the CMP selectivity ratio between the semiconductor substrate 100 and the insulation layer 130 may be at least 1:10. Advantageously, the CMP selectivity ratio of a slurry that includes a $CeO_2$ group abrasive with respect to the semiconductor substrate 100 surface and the insulation layer 130 may be sufficient to allow the semiconductor substrate 100 surface to be used as a CMP stop. As a result, a more consistent level of polishing may be maintained over the surface of the semiconductor substrate 100, which may result in a more uniform thickness in the isolation layer 130.

A silica group abrasive is typically sensitive to variations in the pH of the slurry. Specifically, if the pH of the slurry is reduced, then the removal rate of the oxide layer may be reduced. The $CeO_2$ group abrasive, however, is generally less sensitive to the pH variation of a slurry than the silica group abrasive. Therefore, changes in the pH of the slurry may result in negligible changes in the removal rate of the insulation layer 130. Therefore, the present invention may increase the process margin with respect to the pH of the slurry used in a CMP operation.

According to another aspect of the present invention, a step may be formed between the isolation layer 150 and the semiconductor substrate 100 surface such that the step may be recognized by an alignment apparatus. Beneficially, a process step for forming an alignment key may be omitted. The step may be formed between the isolation layer 150 and the semiconductor substrate 100 surface by selectively etching either the isolation layer 150 or the semiconductor substrate 100 surface to recess the etched region relative to the non-etched region. The step difference between the isolation layer 150 and the semiconductor substrate 100 surface is preferably 100 Å–1000 Å. The step difference may be used as an alignment key for subsequent processing, such as photolithographic processes that form a gate electrode.

According to another aspect of the present invention, a sacrificial oxide layer may be grown to a thickness of 50 Å–200 Å through a sacrificial oxidation process. Ion-implantation of impurities for wells, channel stops, and threshold voltage control may be performed. The sacrificial oxide layer may then be removed using a silicon oxide layer etchant, such as buffered oxide etchant (BOE) or hydrofluoric acid (HF). The sacrificial oxidation process may reduce defects or damage on the semiconductor substrate 100 surface, which may be generated during the CMP operation, to encourage later growth of a high quality gate oxide layer.

As described above, according to a first embodiment of the present invention, the trench T is formed in the semiconductor substrate 100 using photoresist as a mask and the mask is removed after forming the trench T. Therefore, the steps of growing a pad oxide layer, depositing a nitride layer, etching to form the mask patterns, and removing the nitride layer, which may be practiced in conventional trench isolation methods, may be eliminated. The elimination of the nitride layer may also reduce the aspect ratio of the trench T. In addition, the CMP selectivity ratio of a slurry that includes a $CeO_2$ group abrasive may be sufficient to allow the semiconductor substrate 100 surface to be used as a CMP stop. As a result, a more consistent level of polishing may be maintained over the surface of the semiconductor substrate 100, which may result in a more uniform thickness in the isolation layer 130.

Figure 5:
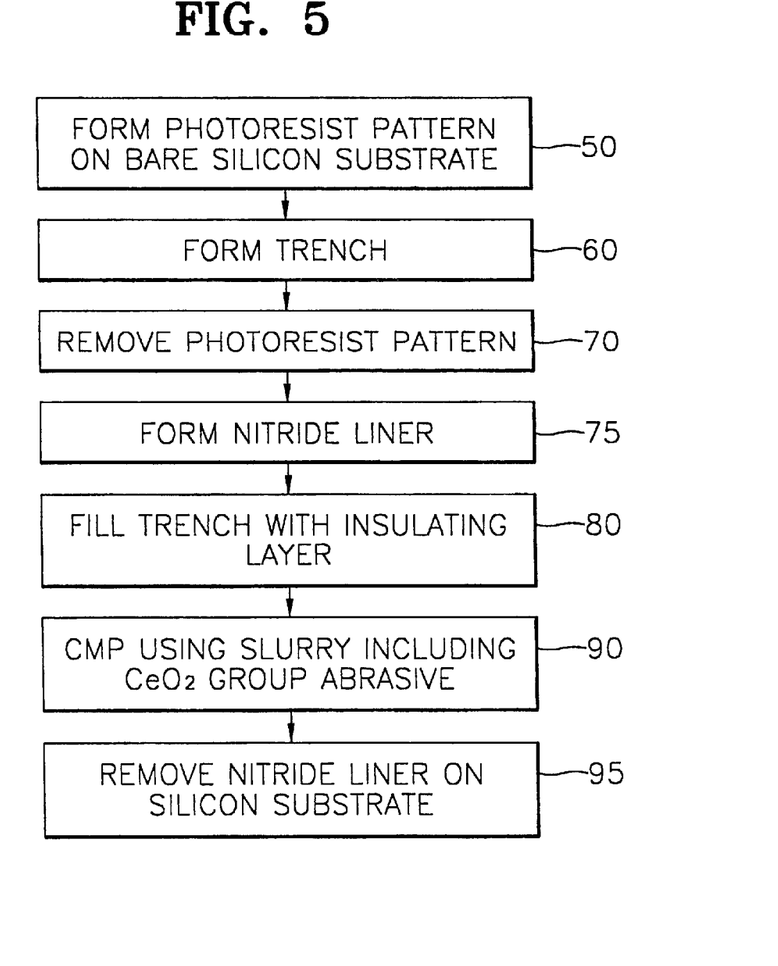
FIG. 5 is a flow chart that illustrates trench isolation methods according to a second embodiment of the present invention.

FIG. 5 is a flow chart that illustrates trench isolation methods according to a second embodiment of the present invention. Operations begin at block 50 where a photoresist mask pattern may be formed on a substrate surface. The substrate surface is then etched through the photoresist mask pattern to form a trench at block 60. The photoresist pattern may be removed at block 70. These operations have been described hereinabove with reference to FIG. 2. Once the photoresist pattern has been removed, a nitride liner may be formed on the substrate surface and in the trench T at block 75 and an insulation layer may be formed on the nitride liner such that the trench is filled at block 80. The upper surface of the insulation layer material may be planarized to substantially the same level as the substrate surface to form an isolation layer in the trench by performing a CMP operation at block 90. Preferably, the CMP operation is performed using a slurry having a high CMP selectivity ratio with respect to the insulation layer and the nitride liner, respectively. For example, a slurry that includes a $CeO_2$ group abrasive may be used to achieve the desired CMP selectivity ratio. Finally, at block 95, the nitride liner may be removed from the substrate surface. The nitride liner may be used as a CMP stop so that the isolation layer may have a more uniform thickness than that provided by the FIG. 2 embodiment of trench isolation methods. Moreover, the nitride liner may also reduce the number of defects that may be generated during the CMP operation.

Figure 6A:
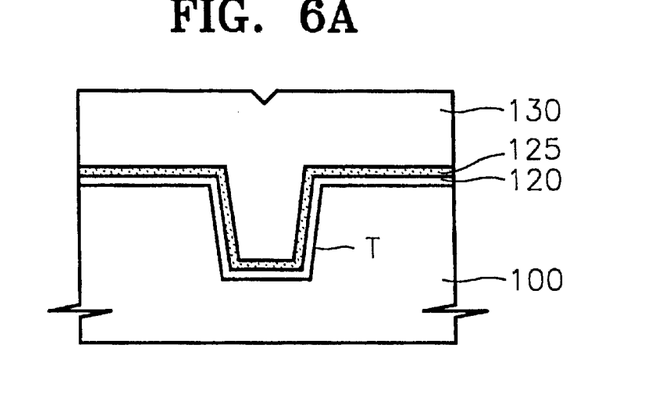
FIGS. 6A–6C are cross-sectional views of integrated circuits that illustrate trench isolation methods according to the second embodiment of the present invention.

Integrated circuits that illustrate trench isolation methods of FIG. 5 will be described hereafter with reference to FIGS. 6A–6C. FIG. 6A illustrates the formation of a trench T, which is filled with an insulation layer 130 as discussed hereinabove with reference to the first embodiment of FIGS. 2, 3A, and 3B. In contrast with the first embodiment, however, a nitride liner 125 is formed on the semiconductor substrate 100 surface and in the trench T prior to the formation of the insulation layer 130.

The nitride liner 125 may inhibit the oxidation process on the sidewalls of the trench T that may result from filling the trench T with the insulation layer 130 material. Accordingly, the nitride liner 125 is preferably formed to a sufficient thickness so as to prevent the oxidation of the trench T sidewalls. If the nitride liner 125 is insufficiently thick, then the nitride liner 125 may not prevent oxygen diffusion into the semiconductor substrate 100 when the trench T is filled with the insulation layer 130 material. Alternatively, if the nitride liner 125 is too thick, then mechanical stress may be applied to the interface between the semiconductor substrate 100 and the nitride liner 125, which may enhance the difficulty in filling the trench T with the insulation layer 130 material. The nitride liner 125 may also be used as a CMP stop; therefore, if the nitride liner is thicker than is necessary to prevent oxidation on the trench T sidewalls, then the etching time may be increased. In accordance with the present invention, the nitride liner may be formed to a thickness of approximately 50 Å–300 Å, and preferably approximately 100 Å.

Similar to the first embodiment of FIGS. 2, 3A, and 3B, a thermal oxide layer 120 may be formed on the semiconductor substrate 100 surface and in the trench T to a thickness of approximately 30 Å–150 Å prior to the formation of the nitride liner 125 and the insulation layer 130. After forming the insulation layer 130, a thermal treatment may be performed to intensify the density of the insulation layer 130.

Figure 6B:
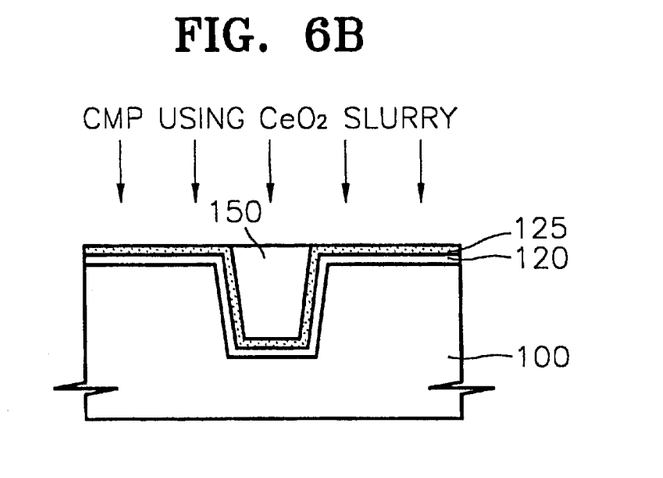

FIG. 6B illustrates the formation of an isolation layer 150 in the trench T by performing a CMP operation on the insulation layer 130. In particular, CMP is performed using a slurry that includes a $CeO_2$ group abrasive and a highly anionic surfactant, such as polyvinylsulphonate (PVS). Preferably, the slurry has a CMP selectivity ratio of at least 1:20 between the nitride liner 125 and the insulation layer 130, respectively. It is also preferable that the pH of the slurry be controlled such that the zeta potential of the insulation layer 130 has a negative value and the zeta potential of the nitride liner 125 has a positive value.

FIG. 4 illustrates the CMP operation using a slurry that includes a $CeO_2$ group abrasive and an anionic surfactant in more detail. By maintaining the pH of the slurry as discussed in the foregoing, the anionic surfactant may adhere to the nitride liner 125 surface, which has a positive zeta potential. This may suppress reaction of the $CeO_2$ group abrasive with the nitride liner 125. Conversely, little to none of the anionic surfactant may adhere to the insulation layer 130, which has a negative zeta potential. As a result, the $CeO_2$ group abrasive may react with the insulation layer 130 to facilitate removal of the insulation layer 130. As shown in FIG. 4, the surface of the positively charged nitride liner 125 is passivated with the anionic surfactant so that the $CeO_2$ group abrasive polishes the surface of the insulation layer 130.

It has been found that when the pH of a slurry that includes a $CeO_2$ group abrasive and an anionic surfactant is maintained at approximately 7, the CMP selectivity ratio between the nitride liner 125 and the insulation layer 130 may be at least 1:20. Advantageously, the CMP selectivity ratio of a slurry that includes a $CeO_2$ group abrasive may be sufficient to allow the nitride liner 125 surface to be used as a CMP stop. Thus, in the second embodiment of the present invention in which a nitride liner 125 is used as a CMP stop, the insulation layer 130 may be removed with greater consistency and uniformity across the semiconductor substrate 100 and trench T surface than could be achieved by using the semiconductor substrate 100 as a CMP stop where the CMP selectivity ratio between the semiconductor substrate 100 and the insulation layer 130 is approximately 1:10.

Figure 6C:
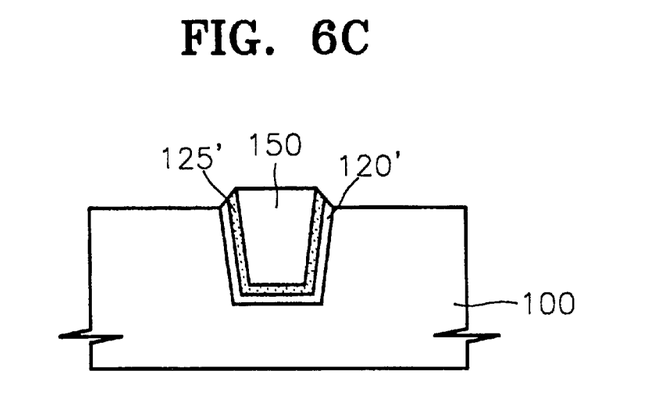

FIG. 6C illustrates the removal of the nitride liner 125 from the semiconductor substrate 100 surface. Specifically, the nitride liner 125 may be removed through selective wet etching using a nitride etchant, such as phosphoric acid, or by dry etching using a plasma. Preferably, the nitride liner 125 is removed from the semiconductor substrate 100 surface by wet etching for approximately 5 minutes using phosphoric acid at approximately 165° C. As shown in FIG. 6C, after removal of the nitride liner 125 from the semiconductor substrate 100 surface, a nitride liner 125' and a thermal oxide layer 120' are defined within the trench T.

Similar to the first embodiment of FIGS. 2, and 3A–3C, a step may be formed between the isolation layer 150 and the semiconductor substrate 100 surface such that the step may be recognized by an alignment apparatus. In addition, a sacrificial oxide layer may be grown to a thickness of 50 Å–200 Å through a sacrificial oxidation process.

As described above, according to a second embodiment of the present invention, the trench T is formed in the semiconductor substrate 100 using photoresist as a mask. The mask is then removed after forming the trench T. As a result, the manufacturing process may be simplified and the aspect ratio of the trench T may be reduced in comparison with conventional STI methods. In addition, a nitride liner 125 is used as a CMP stop, which may result in a more uniform thickness in the isolation layer 150 than may be attained via the first embodiment of FIGS. 2 and 3A–3C. Moreover, because the semiconductor substrate 100 surface is not used as a CMP stop, defects, such as scratches, that may be generated during the CMP process may be prevented.

Figure 7:
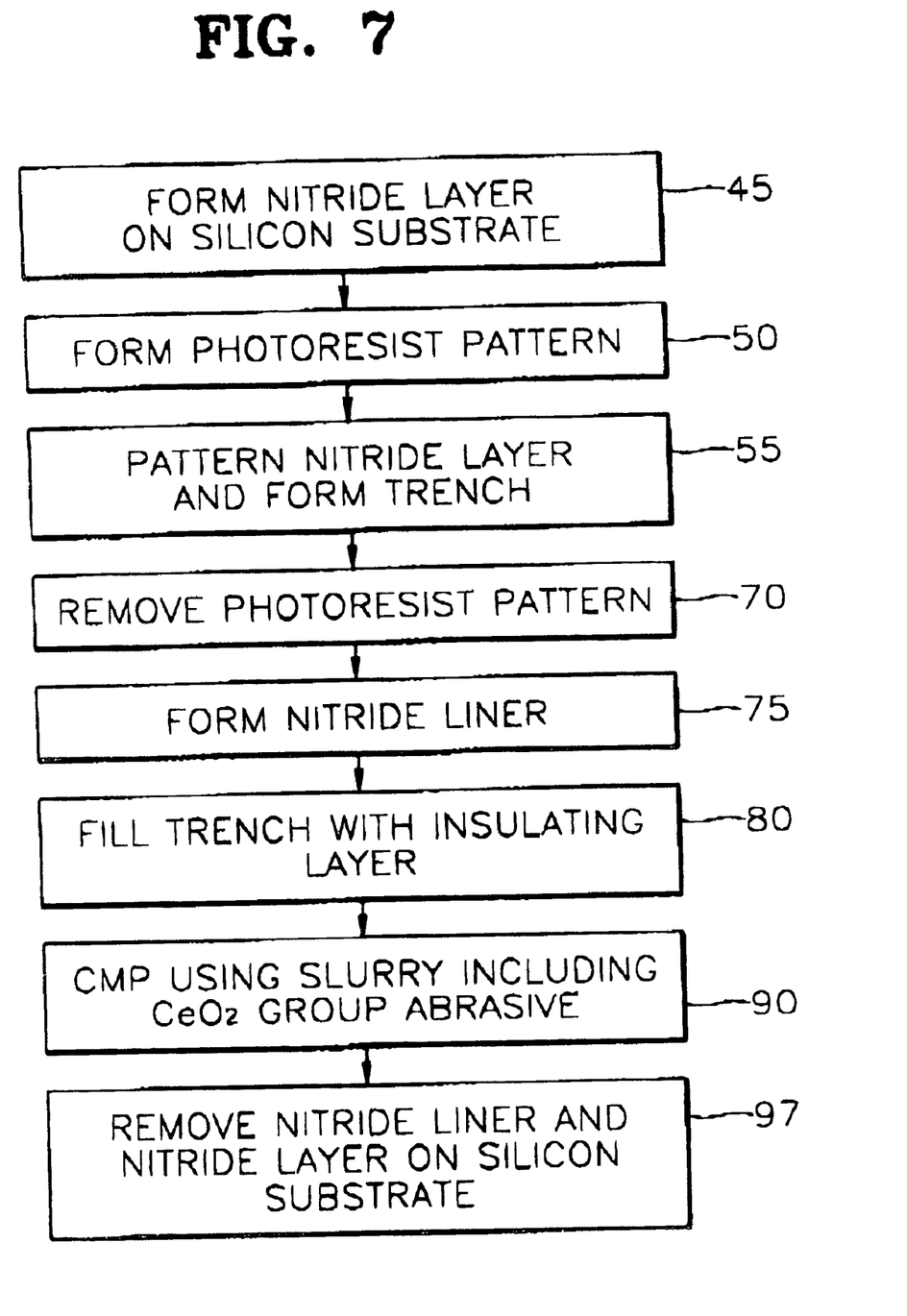
FIG. 7 is a flow chart that illustrates trench isolation methods according to a third embodiment of the present invention.

FIG. 7 is a flow chart that illustrates trench isolation methods according to a third embodiment of the present invention. Operations begin at block 45 where a nitride layer is formed on the substrate surface. At block 50, a photoresist mask pattern may be formed on the nitride layer. Thereafter, at block 55, the nitride layer and the substrate surface are etched using the photoresist pattern as a mask so that the nitride layer is patterned and a trench is formed in the substrate at the same time. The photoresist pattern may then be removed at block 70. Once the photoresist pattern has been removed, a nitride liner may be formed on the nitride layer on the substrate surface and on the trench at block 75. An insulation layer may then be formed on the resulting structure such that the trench is filled at block 80. The upper surface of the insulation material may be planarized to substantially the same level as the substrate surface to form an isolation layer in the trench by performing a CMP operation at block 90. Preferably, the CMP operation is performed using a slurry having a high CMP selectivity ratio with respect to the insulation layer and the nitride liner, respectively. For example, a slurry that includes a $CeO_2$ group abrasive may be used to achieve the desired CMP selectivity ratio. Finally, at block 97, the nitride liner and the nitride layer may be removed from the substrate surface.

The third embodiment of the present invention uses more manufacturing processing steps than the first or second embodiments. Nevertheless, the nitride liner and the nitride layer may be used as a CMP stop so that the isolation layer may have a more uniform thickness than that provided by the FIG. 2 and FIG. 5 embodiments of trench isolation methods.

Figure 8A:
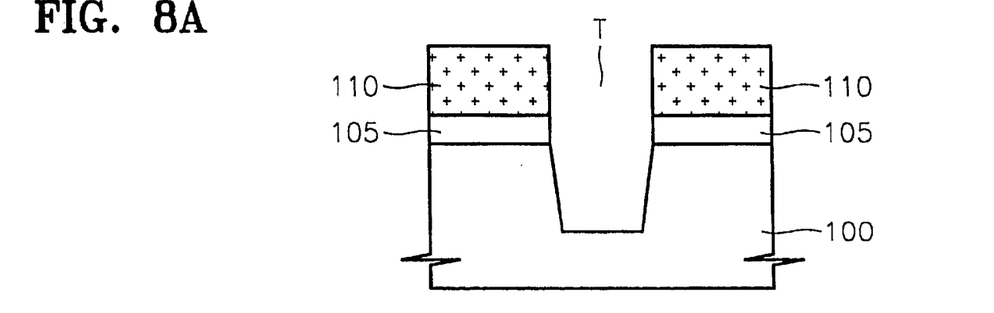
FIGS. 8A–8D are cross-sectional views of integrated circuits that illustrate trench isolation methods according to the third embodiment of the present invention.

Integrated circuits that illustrate trench isolation methods of FIG. 7 will be described hereafter with reference to FIGS. 8A–8D. FIG. 8A illustrates the formation of a silicon oxynitride (SiON) layer 105 on the semiconductor substrate 100 surface and the formation of a photoresist layer on the silicon oxynitride layer 105. Thereafter, the photoresist layer is pattern into a photoresist pattern 110, which defines an isolation region. After forming the photoresist pattern, the silicon oxynitride layer 105 and the semiconductor substrate 100 surface are etched using the photoresist pattern 110 as a mask. As a result, the silicon oxynitride layer 105 is patterned and in the trench T is formed in the silicon substrate 100 at the same time. The silicon oxynitride layer 105 may be used as a CMP stop for a subsequent CMP operation and may also be used to facilitate etching of the trench T. In accordance with the present invention, the silicon oxynitride layer 105 may be formed to a thickness of approximately 100 Å–1500 Å, and preferably approximately 500 Å.

Figure 8B:
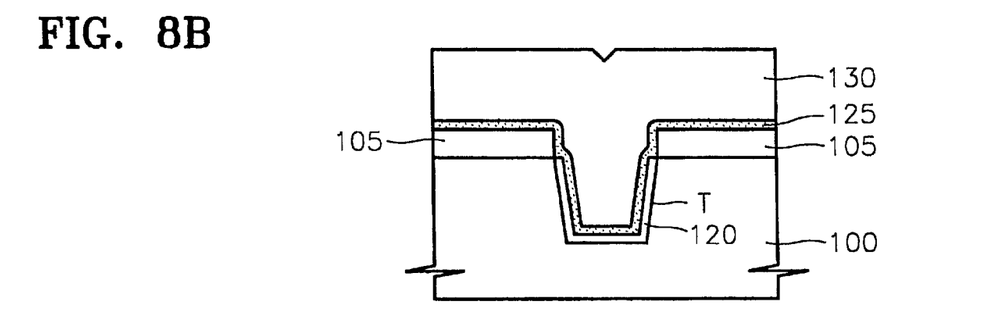

Referring now to FIG. 8B, after removing the photoresist pattern 110, a nitride liner 125 is formed on the semiconductor substrate 100 surface and in the trench T. The trench T is then filled with an insulation layer 130 as discussed hereinabove with reference to FIG. 6A.

Likewise, as discussed hereinabove with reference to the first and second embodiments of FIGS. 3A–3C and 6A–6C, respectively, a thermal oxide layer 120 may be formed on the semiconductor substrate 100 surface and in the trench T to a thickness of approximately 30 Å–150 Å prior to the formation of the nitride liner 125 and the insulation layer 130. After forming the insulation layer 130, a thermal treatment may be performed to intensify the density of the insulation layer 130.

Figure 8C:
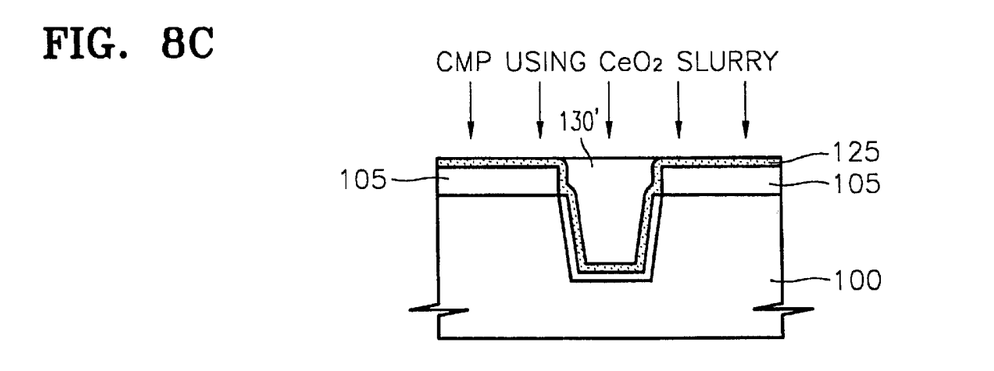

FIG. 8C illustrates the formation of an isolation layer 130' in the trench T by performing a CMP operation on the insulation layer 130. In particular, CMP is performed as discussed hereinabove with reference to FIG. 6B by using a slurry that includes a $CeO_2$ group abrasive and a highly anionic surfactant, such as polyvinylsulphonate (PVS). Preferably, the slurry has a CMP selectivity ratio of at least 1:20 between the nitride liner 125 and the insulation layer 130, respectively. It is also preferable that the pH of the slurry be controlled such that the zeta potential of the insulation layer 130 has a negative value and the zeta potential of the nitride liner 125 has a positive value.

Figure 8D:
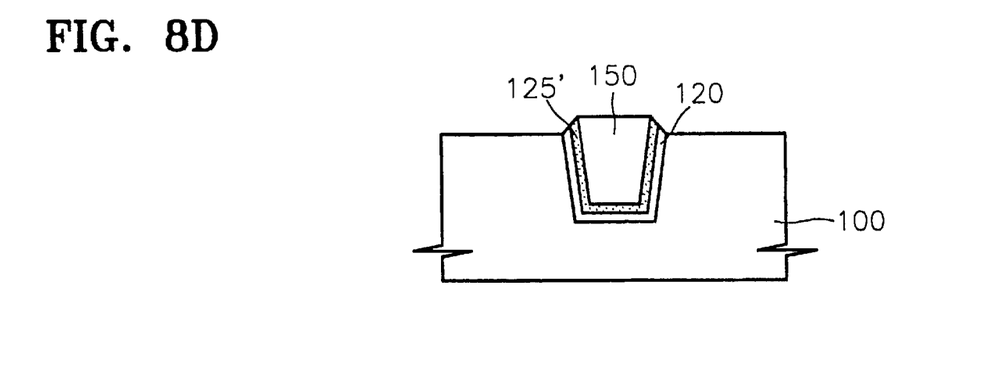

FIG. 5D illustrates the removal of the nitride liner 125 and the silicon oxynitride layer 105 from the semiconductor substrate 100 surface. Specifically, the nitride liner 125 may be removed through selective wet etching using a nitride etchant, such as phosphoric acid. Like the nitride liner 125, the silicon oxynitride layer 105 has a generally high etching rate with respect to phosphoric acid. Therefore, the nitride liner 125 and the silicon oxynitride layer 105 may be removed together using phosphoric acid. As shown in FIG. 8D, after removal of the nitride liner 125 and the silicon oxynitride layer 105 from the semiconductor substrate 100 surface, a nitride liner 125', a thermal oxide layer 120', and an isolation layer 150 are defined within the trench T.

Similar to the first and second embodiments discussed hereinabove, a step may be formed between the isolation layer 150 and the semiconductor substrate 100 surface such that the step may be recognized by an alignment apparatus.

In addition, a sacrficial oxide layer may be grown to a thickness of 50 Å–200 Å through a sacrificial oxidation process.

As described above, according to a third embodiment of the present invention, a nitride liner 125 and a silicon oxynitride layer 105 are used as a CMP stop, which may result in a more uniform thickness in the isolation layer 150 than may be attained via the first and second embodiments of FIGS. 3A–3C and 6A–6C, respectively. Moreover, because the semiconductor substrate 100 surface is not used as a CMP stop, defects, such as scratches, that may be generated during the CMP process may be prevented.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

We claim:

1. A trench isolation method for an integrated circuit, comprising the steps of:

etching a substrate surface to form a trench therein;

forming a nitride liner directly on the substrate surface and in the trench;

forming an insulation layer on the nitride liner; and chemical-mechanical polishing the insulation layer to form an isolation layer in the trench.

2. A trench isolation method as recited in claim 1, wherein the following step is performed prior to the step of etching the substrate surface to form the trench therein:

forming a photoresist mask pattern on the substrate surface.

3. A trench isolation method as recited in claim 2, wherein the following step is performed between the steps of etching the substrate surface to form the trench therein and forming the nitride liner directly on the substrate surface and in the trench:

removing the photoresist mask pattern from the substrate surface.

4. A trench isolation method as recited in claim 1, wherein the step of chemical-mechanical polishing the insulation layer to form the isolation layer in the trench comprises the step of:

chemical-mechanical polishing the insulation layer using a slurry that comprises a $CeO_2$ group abrasive and an anionic surfactant to form the isolation layer in the trench.

5. A trench isolation method as recited in claim 4, wherein the slurry further comprises an anionic surfactant.

6. A trench isolation method as recited in claim 5, wherein the slurry has a pH of approximately 7.

7. A trench isolation method as recited in claim 1, wherein the slurry has a chemical-mechanical polishing selectivity ratio of at least 1:20 between the nitride liner and the insulation layer, respectively.

8. A trench isolation method as recited in claim 1, wherein the following step is performed between the steps of etching the substrate surface to form the trench therein and forming the nitride liner on the substrate surface and in the trench:

forming a thermal oxide layer onthe substrate surface and in the trench.

9. A trench isolation method as recited in claim 1, wherein the following step is performed between the steps of forming the insulation layer on the nitride liner and chemical-mechanical polishing the insulation layer to form the isolation layer in the trench:

thermally treating the insulation layer.

10. A trench isolation method as recited in claim 1, wherein the following step is performed after the step of chemical-mechanical polishing the insulation layer to form the isolation layer in the trench:

removing the nitride liner from the substrate surface.

11. A trench isolation method as recited in claim 10, wherein the following step is performed after the step of removing the nitride liner from the substrate surface:

forming a step between the isolation layer and the substrate surface by etching the substrate surface to thereby recess the substrate surface relative to the isolation layer.

12. A trench isolation method as recited in claim 10, wherein the following step is performed after the step of removing the nitride liner from the substrate surface:

forming an oxide layer on the isolation layer and the substrate surface;

implanting ions through the oxide layer; and removing the oxide layer form the trench therein and forming the nitride liner directly on the substrate surface and in the trench:

removing the photoresist mask pattern from the substrate surface.

* * * * *

UNITED STATES PATENT AND TRADEMARK OFFICE
CERTIFICATE OF CORRECTION

PATENT NO.    : 6,537,914 B1
DATED         : March 25, 2003
INVENTOR(S)   : Park et al.

It is certified that error appears in the above-identified patent and that said Letters Patent is hereby corrected as shown below:

Column 12,
Line 13, should read as follows:
-- the nitride liner directly on the substrate surface and in the trench: --
Line 14, should read as follows:
-- forming a thermal oxide layer on the substrate surface and --
Lines 41-46, delete everything after "removing the oxide layer" in line 41.

Signed and Sealed this

Fourth Day of November, 2003

JAMES E. ROGAN
*Director of the United States Patent and Trademark Office*